(12) United States Patent
Margeson

(10) Patent No.: US 7,296,777 B2
(45) Date of Patent: Nov. 20, 2007

(54) ACCELERATION CLAMP ASSIST

(75) Inventor: Christopher S. Margeson, Sunnyvale, CA (US)

(73) Assignee: Nikon Corporation, Tokyo (JP)

( * ) Notice: Subject to any disclaimer, the term of this patent is extended or adjusted under 35 U.S.C. 154(b) by 152 days.

(21) Appl. No.: 10/807,291

(22) Filed: Mar. 24, 2004

(65) Prior Publication Data
US 2005/0211867 A1    Sep. 29, 2005

(51) Int. Cl.
*F16M 13/00*    (2006.01)

(52) U.S. Cl. .................. 248/550; 248/500; 248/680

(58) Field of Classification Search ............. 248/550, 248/226.11, 230.4, 231.51, 500, 680
See application file for complete search history.

(56) References Cited

U.S. PATENT DOCUMENTS

| | | | |
|---|---|---|---|
| 4,408,832 A | | 10/1983 | Hartman et al. |
| 5,151,809 A | | 9/1992 | Meier |
| 5,410,206 A | * | 4/1995 | Luecke et al. ............ 310/328 |
| 5,417,464 A | * | 5/1995 | Seaberg et al. ............ 294/88 |
| 5,474,226 A | * | 12/1995 | Joseph ................. 228/112.1 |
| 5,691,473 A | * | 11/1997 | Peleg .................... 73/573 |
| 5,896,228 A | | 4/1999 | Inoue et al. |
| 6,560,846 B1 | * | 5/2003 | Shioya et al. ............. 29/525 |
| 6,711,317 B2 | * | 3/2004 | Jin et al. ................. 385/18 |
| 2002/0029643 A1 | * | 3/2002 | Juranitch et al. ........ 73/862.08 |
| 2003/0234916 A1 | | 12/2003 | Watson |
| 2003/0234917 A1 | | 12/2003 | Watson |
| 2003/0234918 A1 | | 12/2003 | Watson |

OTHER PUBLICATIONS

J.W. Hardy; "Active Optics: A New Technology for the Control of Light"; Proceedings of the IEEE, vol. 66, No. 6, Jun. 1978; pp. 651-697.

M.A. Ealey; "Active and Adaptive Optical Components: The Technology and Future Trends"; SPIE vol. 1543, Active and Adaptive Optical Components, 1991; pp. 2-34.

M.A. Ealey; "Actuators: Design Fundamentals, Key Performance Specifications, and Parametric Trades"; SPIE vol. 1543, Active and Adaptive Optical Components, 1991;lpp. 346-362.

M.A. Ealey et al.; "Deformable Mirrors: Design Fundamentals, Key Performance Specifications, and Parametric Trades"; SPIE vol. 1543m Active and Adaptive Optical Components, 1991; pp. 36-51.

* cited by examiner

*Primary Examiner*—Anita M. King
(74) *Attorney, Agent, or Firm*—Whitham, Curtis, Christofferson & Cook, PC

(57) ABSTRACT

Forces are minimized in an object supported relative to a surface by providing a first, preferably static force sufficient to retain the object is position when at rest, preferably through a clamping arrangement having a first actuator, measuring or predicting an acceleration and applying a second, preferably dynamic force corresponding to the acceleration. The first and second forces are preferably arranged to be additive or reinforcing but the arrangement can be made fail-safe at the expense of increased power consumption by arranging the first force in accordance with the maximum anticipated acceleration and counteracting the first force with the second force for lesser or zero accelerations. The second force is preferably provided by a clamp of arbitrary configuration which can be moved into and out of engagement with the object. By minimizing forces applied to the object in such a manner, damage such as creep and propagation of crystal lattice dislocations over time can largely be prevented.

15 Claims, 7 Drawing Sheets

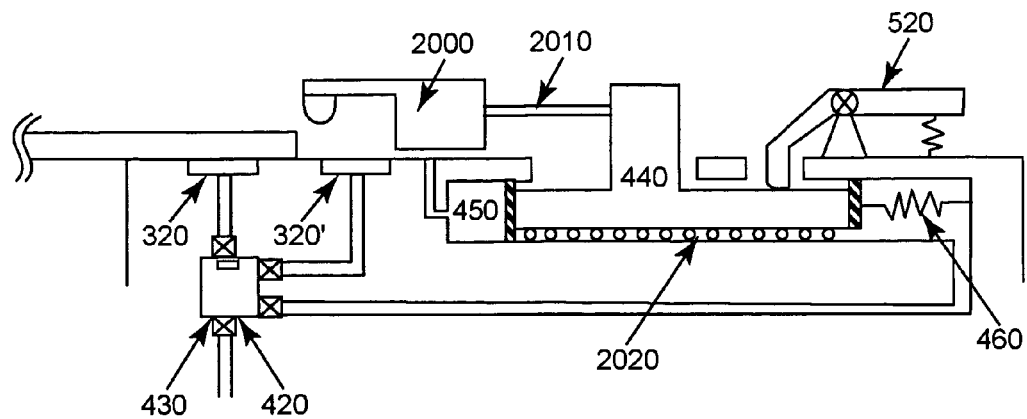
Figure 14
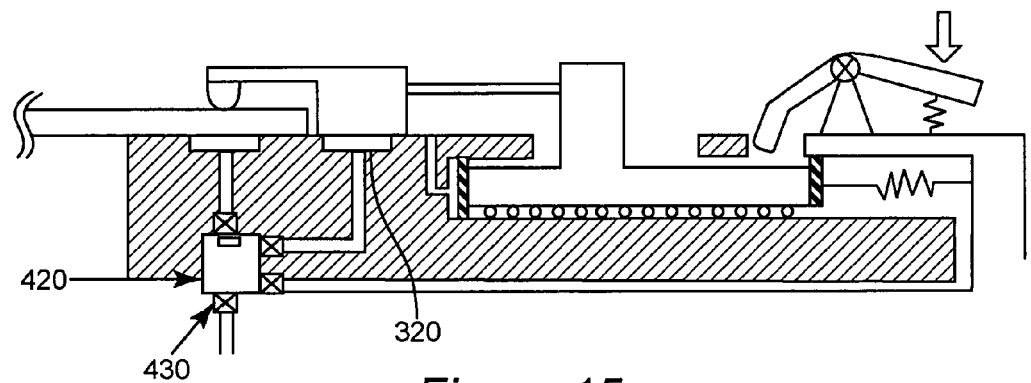
Figure 15
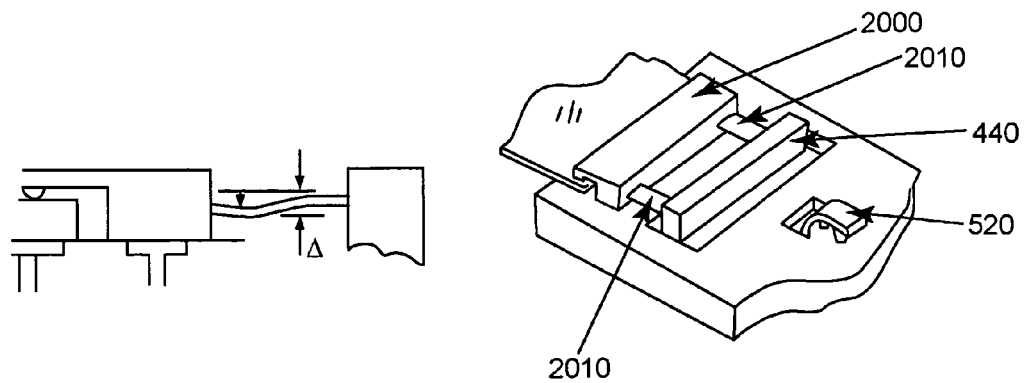
Figure 16
Figure 17

ACCELERATION CLAMP ASSIST

BACKGROUND OF THE INVENTION

1. Field of the Invention

The present invention generally relates to frictionally engaged assemblies of parts which are subject to intermittent accelerations and, more particularly, to arrangements for the clamping together of parts which are subject to degradation due to application of high levels of internal stress over time in which the forces caused by the clamping arrangements are maintained at minimal levels even during acceleration.

2. Description of the Prior Art

Many devices are known in which some of the constituent parts are held together in precise juxtaposition by clamping arrangements of various forms. Clamping arrangements and frictional engagement between parts are often preferred since precise alignment in the mounting plane can be more readily achieved. However, facilitating precise alignment in such a fashion with clamping arrangements often makes the assembly subject to relative shifting of parts in the mounting plane under strong acceleration forces having vector components in the mounting plane (hereinafter referred to as "in-plane" forces) such as impacts on the assembly or its supports (e.g. packaging) either in use or during shipping. This tendency, while undesirable, is often tolerated where one or more of the clamped parts is made of a more or less brittle material and repairable loss of alignment is preferable to breakage of a part during unexpected accelerations while the parts may be maintained in accurate alignment under anticipated in-plane accelerations. For example, a shipping specification may be to withstand accelerations of either three or six "G's" (e.g. three or six times the force of gravity on the mass of the part) during shipping which may be accommodated by the device/assembly, its mounting or protective packaging or a combination thereof. Many clamping arrangements are known which may be used singly or in combination to develop static forces to counteract or withstand virtually any anticipated acceleration up to the level of producing damage to individual parts without relative shifting of parts while providing a degree of protection from breakage.

For an optical system relying on a clamping system to secure optics in place and in alignment, large clamping forces may be required to meet the 6 G specification where the clamping force must at least equal the mass of the optic multiplied by six times the acceleration of gravity. Due to various factors such as available space, materials costs and the like, space for holding the optics may be very small. Large clamping forces applied over small areas for holding or mounting the optic also generate high levels of stress. Unfortunately, some materials from which some parts of an assembly may be made may be subject to degradation of important properties when subjected to stresses for substantial periods of time.

Perhaps more importantly for some optical systems, glass will exhibit stress-induced birefringence (which can be observed, for example, as colors or color fringes when the object is placed between crossed polarizers and transilluminated) which will gradually become permanent over time. Permanence of stress-induced birefringence can also be caused by a relatively few limited temperature excursions in a potentially short period of time or a single temperature excursion if sufficiently great while stress is applied. This phenomenon is well-recognized and has been used for the study of stresses in solid objects for many years. However, in systems where permanent stress induced birefringence is not a desired result and latent and constant stresses are present, it should be recognized that small and uncontrolled changes in environmental conditions can unpredictably accelerate the occurrence of permanent stress-induced birefringence and render an optical system, for example, unusable in a very short time.

Some materials used for the optics may be vulnerable to high stress under accelerations and may fail or break under those conditions. Varying the clamping force, and ultimately the stress, during accelerations may reduce the possibility of damage to the optic.

In other applications such as for clamping of a wafer and/or reticle (both of which are generally subjected to repeated movement and accelerations when in use) in a projection lithography tool where the clamped part has a crystalline structure, small imperfections in the crystal lattice may be caused and/or propagated leading to increased brittleness and possibly breakage.

The amount of force which must be placed on an object to maintain it in a given relative position under a given maximum specified or anticipated acceleration can vary greatly, depending on the material and elasticity of contiguous parts and the mass of the clamped part. Therefore, the amount of stress which is induced in a part by such a force also may vary greatly but once determined and developed by springs, piezoelectric devices and the like which are known for clamping the parts together, generally remains unchanged notwithstanding the fact that important properties of the part(s) may be degraded over time by such a force. In any case, the force required to prevent relative shift of parts under acceleration is greater than the force required to do so when the assembly is at rest, but, by the same token, minimization of clamping forces to limit degradation over time will be insufficient to maintain alignment of parts when an acceleration is encountered.

SUMMARY OF THE INVENTION

The present invention provides a technique and apparatus for minimizing forces applied to a part which is maintained in position by clamping while maintaining alignment of clamped parts during accelerations of substantially arbitrary magnitude. This meritorious effect is preferably achieved by providing a first clamping structure providing a minimum level of clamping force to maintain juxtaposition of parts while at rest, sensing or predicting acceleration of the assembly and dynamically providing increased, supplemental clamping force with the same or additional clamp structures (such as in conjunction with vacuum or electrostatic chucks used on reticle stages in lithography tools or other forms of moveable carriages but could also be of the form of hard or flexured mounts or clamps which may be preloaded by a washer or spring) in accordance with the acceleration in order to obtain a total clamping force which is sufficient to maintain juxtaposition and alignment of parts during such acceleration. However, for fail-safe operation at the expense of increased power consumption the static and dynamic force may be arranged in opposition to achieve the same or varied effect(s). Alternatively but not preferably, dynamic clamping may be used as the sole clamping mechanism.

BRIEF DESCRIPTION OF THE DRAWINGS

The foregoing and other objects, aspects and advantages will be better understood from the following detailed description of a preferred embodiment of the invention with reference to the drawings, in which:

FIGS. 13, 14, 15, 16 and 17 are detailed illustrations of alternative applications of the invention to a vacuum chuck of a reticle stage of a lithography tool.

DETAILED DESCRIPTION OF A PREFERRED EMBODIMENT OF THE INVENTION

Figure 1:
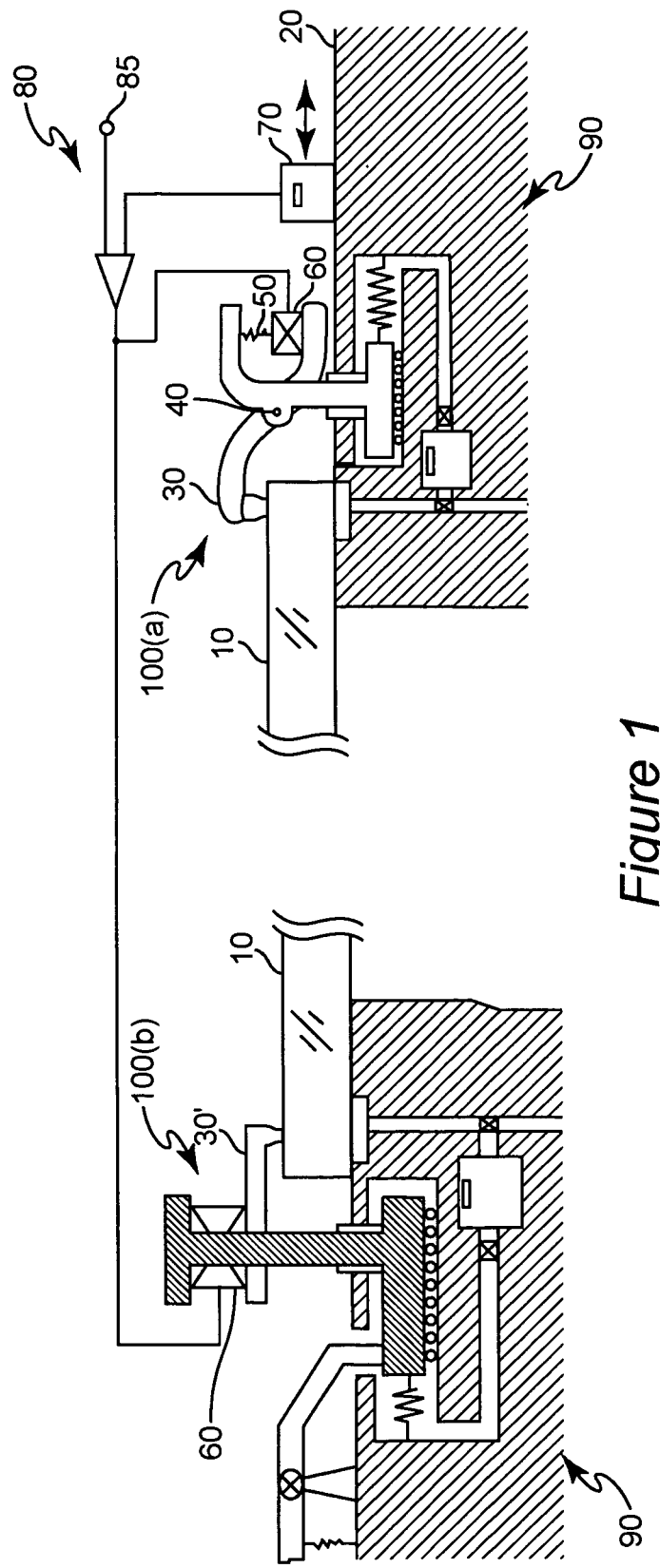
FIG. 1 is a side view of a generalized and schematically depicted form of the invention.

Referring now to the drawings, and more particularly to FIG. 1, there is shown in side view, a schematic depiction of a generalized form of the invention for mounting an object 10 such as a lens, mirror, reticle, mask or the like relative to (e.g. against) a surface 20 with a clamp which, for simplicity, is shown, in one form, as a lever 30 pivotally supported at pivot 40 affixed to surface 20 or, in an alternative form, as a cantilevered arm 30'. Clamp 100a and/or 100b do not have to be initially in contact with object 10. In a preferred embodiment, either clamp 100a or 100b makes contact and, in conjunction with vacuum passage 320 (FIG. 3) supplies the required clamping force for static operation. Alternatively, vacuum passage 320 can supply the required static clamping force (e.g. slightly above the force required to maintain alignment at rest) and clamp 100a and/or 100b may provide an additional force deemed appropriate within a safety factor specification. This additional force might assist in any time lag effects due to the control system as will be discussed below. None of the mechanical details of the clamp 30, 30', mounting surface 20 or object 10 are of any importance to the basic principles of the invention. However, it is preferred that the tip or contact point of clamp 30 is a vacuum compatible/non-outgassing type of rubber or polymer, a non-corrosive metal or even a ruby tip such as that used on the stylus of a surface finish measurement device. It is also preferred for most applications that a plurality of clamp arrangements (e.g. 30, 50, 60, or, collectively, 100) be positioned around the periphery of object 10 as illustrated, for example, in FIGS. 1 or 2A-2C.

The clamp 30 is moved against the object 10 preferably by a passive mechanical link/actuator 50 which may be of any suitable form such as a coil spring, leaf spring or the like or a flexible or elastic arrangement such as a pneumatic or foam pad, elastic link or the like acting in compression, tension and/or torsion. Preferably, the mechanical link and the clamp geometry are arranged to provide the desired minimum force sufficient to maintain object 10 in position when the assembly is at rest. However, somewhat increased force may be acceptable and/or preferable in some applications to more securely hold object 10 in position as will be discussed below.

In any event, an active/dynamic actuator 60 such as a piezoelectric stack, as is preferred, or a solenoid, a magnetostrictive device, pneumatic pressure and/or suction devices and the like or a combination thereof are arranged to provide increased clamping force when needed in accordance with a preferred form of the invention. In the alternative, the mechanical actuator(s) may be arranged to deliver maximum force which is reduced by being counteracted by the active actuator 60. This alternative may provide some advantages in control arrangements (schematically and collectively illustrated by element 80) as will be discussed below. However, this latter alternative will necessarily require additional power and will exhibit increased heat dissipation that may give rise to other problems and does not "fail safe" in regard to maintaining minimum force (although it does fail safe in regard to applying sufficient force to prevent shifting of parts) while operation of the active actuator may be difficult to monitor. Therefore, this latter alternative arrangement is not preferred.

An acceleration reporting device 70 is preferably provided to monitor accelerations which may be imposed on the object 10 and surface 20. For purposes of this description of the invention, the term "acceleration reporting device" is intended to include or encompass accelerometers, stage (e.g. translation table) control systems and/or any system comprising position or motion sensors or providing control of motion (e.g. translation table or stage drivers) having the capability of providing a signal corresponding to position or motion over time from which acceleration of an object can be derived. Such arrangements may preferably include signal conditioning to reduce noise and a high sampling rate to minimize time delays of the output signal. If, however, the invention is employed in an application where accelerations are known (e.g. where the only motions are controlled), such as for holding a reticle/mask in place on the reticle stage of a lithography tool, no measurement is needed since the acceleration signals can be derived from the motion control arrangement but an acceleration measurement device may, nevertheless, be provided for a safety check, an aid to installation or troubleshooting or the like.

Preferably, an acceleration measurement device, if provided, is in line or axial with the active actuator(s) 60 or the object 10 but which will often substantially coincide in location. Such a location and possibly others will allow the acceleration measurement device to be subjected to substantially the same in-plane acceleration as the object 10 or assembly 10, 20 as might not be the case for other locations where the assembly is accelerated along, for example, a circular arc defined by a pivoting mechanism such as a camera mount.

The output of the acceleration reporting device 70 is processed, as symbolically indicated at element 80, and supplied to the active actuator(s) to increase the clamping force to correspond to any acceleration for the duration of the acceleration. This processing may be as simple as amplification or even direct application of the accelerometer output but may be as complex as may be required by the physical properties (e.g. mechanical resonance) of the assembly or other structure with which the assembly may be combined. An additional input 85 may be provided for mixing, adjustment or control of gain, synchronization with other portions of a device in which the assembly is used and the like. It is preferred that the additional clamping force be dynamically variable, continuously or step-wise, with acceleration in a generally analog manner (but not necessarily linearly proportional to acceleration), commensurate with acceleration and limited to a level only slightly in excess of that needed to retain the object 10 in position on mounting surface 20 under a given acceleration or otherwise resist the acceleration detected in both degree, direction and kind (e.g. vibration, impact, etc.).

In general, the frictional engagement between surfaces which are stationary with respect to each other is somewhat greater than the frictional engagement between surfaces sliding over each other. This difference in frictional engagement and/or a slight excess of static clamping force is generally adequate to prevent shifting of the clamped object during processing and application of the accelerometer signal to the dynamic clamping structure, including the response time of the control arrangement. Any inadequacy in this regard can be remedied by increasing the static clamping force which will thus remain well below that required to carry the full acceleration load which may be potentially encountered. Therefore, positioning flanges or pins which may have other undesirable effects in regard to optical elements, in particular, can be avoided while preventing relative shift between an object and its supporting structure. Different types of clamps can be selectively deployed (e.g. by mechanical, electrical or pneumatic arrangements as will be discussed in greater detail below) and/or actuated individually or in combination, possibly by a plurality of signal processing arrangements 80 as may be determined to be needed and desirable under various conditions that are detected by one or more acceleration reporting devices.

Figure 2A:
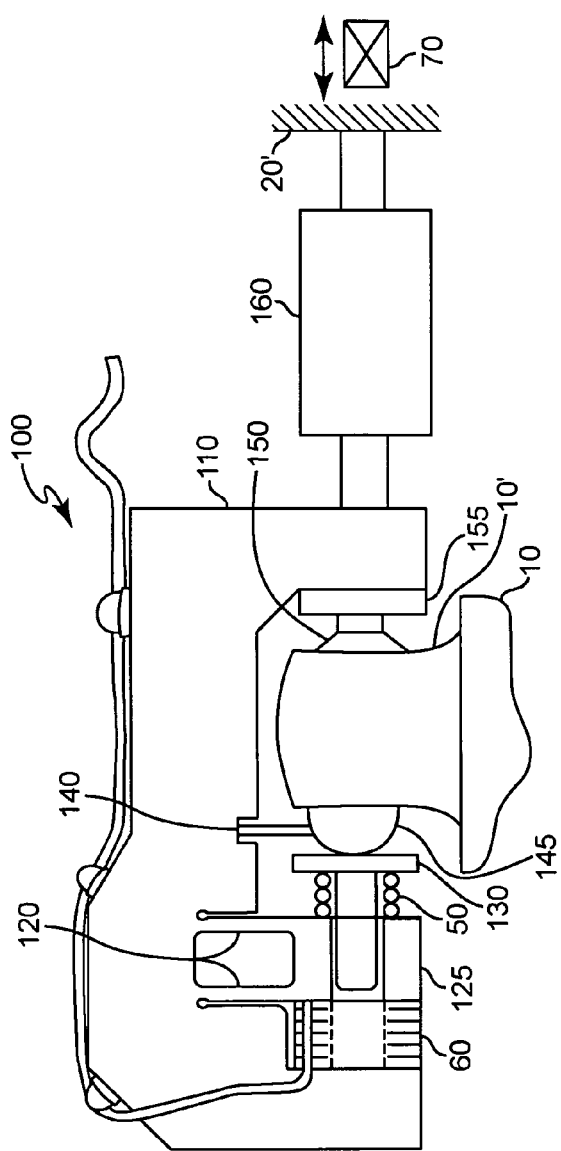
FIG. 2A is a side view of a preferred form of a clamping mechanism in accordance with the invention for retaining a lens with tangential clamping.

Referring now to FIG. 2A, a configuration of a clamp in accordance with the invention which is preferred for the mounting of an optical element such as a lens or mirror is shown. Even though this configuration includes many features not appearing in FIG. 1, as discussed above, the features which are common thereto albeit possibly in a very different form, are identified by the same reference numerals.

Figure 2C:
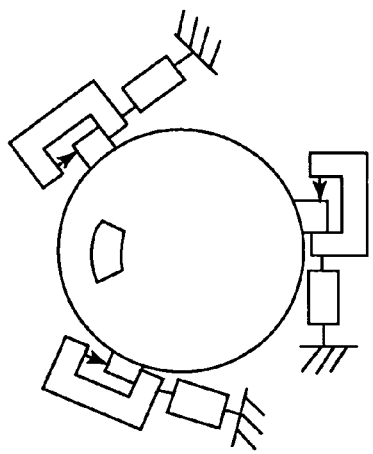
FIGS. 2B and 2C are top and perspective views, respectively, of preferred applications of the clamp of FIG. 2A.
Figure 2B:
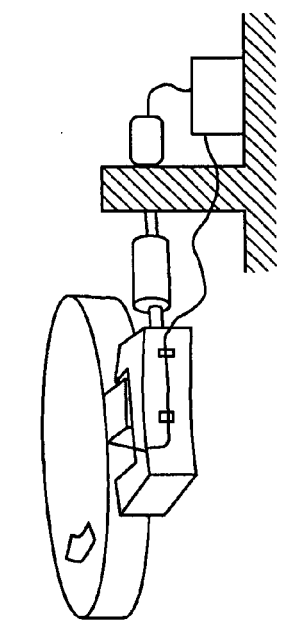

In the case of optical elements which may be subject to distortion by forces transmitted from the mounting locations it is generally preferred to form tabs 10' at the periphery of the optical element (object 10). These tabs are then held by clamps arranged tangentially around the optical element in a direction which is nominally tangential to the periphery of the optical element as illustrated in FIGS. 2B and 2C and such an arrangement is, accordingly, generally referred to as a tangential mount. Clamps may also be attached to flanges or bonded tabs on the lens edge or circumference (outside diameter). Arrangements for adjusting the positions/orientations of the clamps to compensate or control the shape of the optical element may be provided, as well, but are not important to the practice of the invention in accordance with its basic principles and to obtain its meritorious effects.

Clamp 100, in accordance with the invention comprises a generally C-shaped body 110 of relatively stiff but resilient material which preferably includes in the interior space and projecting from an interior surface, a pair of cantilevered arms 120 as a hinge or flexure with one degree of freedom (1 DOF) which carry a support in the form of a sleeve or clamp spring ground 125 for a plunger-like structure 130 which is driven by a spring 50 provided thereon and seated on support 125. The cantilevered arms are preferably formed integrally with clamp body 110 (e.g. machined from the same body of material) which are made somewhat thinner at the ends thereof adjacent support 125 and clamp body 110 to form hinges. Thus, when the arms are flexed slightly, the support moves substantially axially with negligible shift in the location of the axis of plunger 130 (i.e. the movement of a mechanism having two parallel cantilevered arms is along a quadratic curve but for small deflections, will be substantially linear). Another flexure or, in this embodiment, a cantilevered and hinged flexure 140 is also preferably provided to carry a dome-shaped bearing 145 which contacts the mounting tab of the optical element to limit or avoid transfer of non-axial forces thereto. The support also bears on one side of the active actuator 60 (e.g. a piezoelectric stack, bellows, etc.) which, in turn, bears on one end of the clamp body 110.

An adjustment device 150 is provided on the opposite end of clamp body 110 and is preferably adjusted to fully compress spring 50 and to develop the desired minimum retention force. In this regard, the active actuator/piezoelectric stack 60 should be stiff enough and adequately incompressible that the support 125 does not move as this adjustment is made. Full compression of spring 50 allows the entire force developed by active actuator/piezoelectric stack to be delivered and accurately controlled with minimum motion of parts and without interaction of the active actuator/piezoelectric stack 60 with the passive actuator/spring 50 which would generally reduce the force available.

As described above in connection with FIG. 1, acceleration measurement device 70 is preferably located axially or in-line with the active actuator or clamped structure. It is also preferred to include an axial flexure 160 (e.g. rigid in the direction of its axis and the direction of the acceleration of interest but leaving five degrees of freedom) in line with the clamp jaws to provide flexibility of mounting in all directions except the direction of force application by the active actuator/piezoelectric stack 60.

In the embodiments of FIGS. 1 and 2A, the active actuator 60 and passive actuator 50 are combined in the same unitary clamp mechanism. However, it should be understood that such combination in a unitary clamp structure is not required by the basic principles of the invention. Conversely, different elements are not required for providing respective static and dynamic clamping forces in accordance with the principles of the invention.

Figure 3:
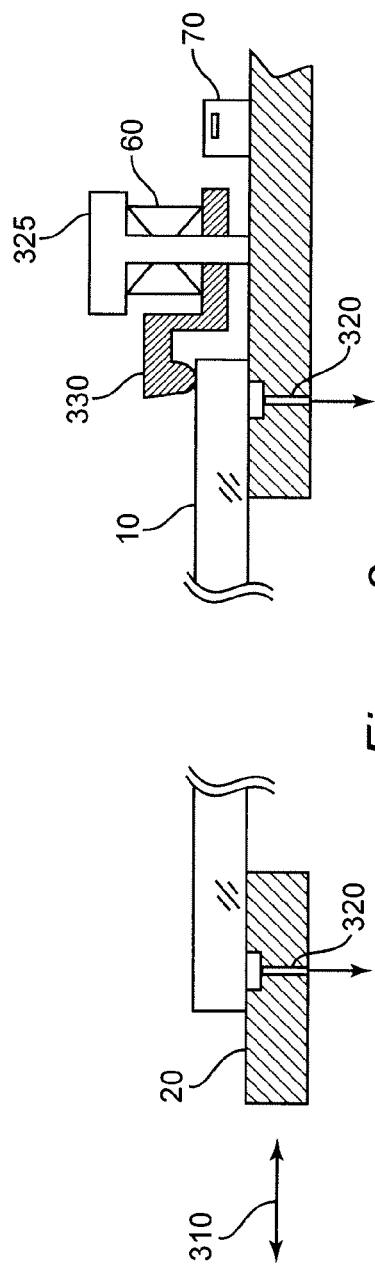
FIG. 3 is a side view of a preferred application of the invention to a vacuum hold-down arrangement such as is used in semiconductor manufacturing tools.
Figure 3A:
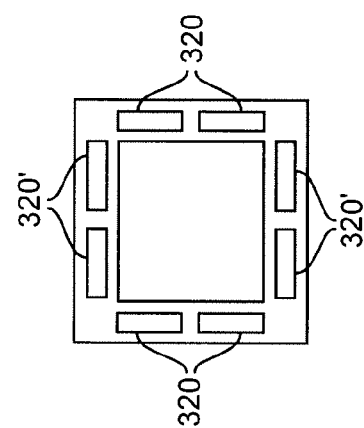
FIG. 3A is a plan view of a vacuum hold down table illustrating application of the invention thereto.

For example, as illustrated in FIG. 3, surface 20 is provided on a transport or translation table, schematically illustrated by double arrow 310, as is often provided for causing movement of a reticle in lithography tools. Alternatively or in combination therewith, FIG. 3A shows a plan view of a vacuum hold down arrangement in which a given level of vacuum or particular vacuum orifices 320 may provide the static clamping force and additional levels of vacuum or additional vacuum orifices 320' correspond to the dynamic clamping force, different levels of vacuum or additional vacuum port area being achieved with valves operated in response to one or more acceleration measurement devices or the stage drive arrangement, as alluded to above collectively as acceleration reporting devices. By the same token, the embodiments of FIGS. 3 and 3A are exemplary of existing arrangements to which the invention can be retrofitted and will serve to demonstrate this quality and property of the invention. As is also often the case in such structures, a vacuum chuck or hold-down arrangement is provided so that access can be provided to the entire surface of the mask or reticle even though such access is not often required during lithographic exposures. Acceleration measurement device 70, if employed, is preferably located in the plane of the mask, reticle or other object 10, as discussed above, to accurately sense the magnitude of in-plane accelerations, if not known from the drive parameters, as the surface 20 is moved by the transport table 310.

To employ the invention in such an arrangement, supports 325 are affixed to or formed integrally with surface 20 and a clamp jaw 330 extending over the object 10 is provided with an active actuator/piezoelectric stack interposed between the jaw 330 and the support 325. The jaw 330 is preferably not directly in contact with object 10 when the active actuator/piezoelectric stack 60 is not energized but suspended above object 10 by a small clearance. When an acceleration of sufficient magnitude to approach the causing of a shift of the object 10 on the chuck 320 including surface 20 is detected by acceleration measurement device 70, the active actuator/piezoelectric stack 60 is activated to bring jaw 330 into contact with object 10 and to apply sufficient additional force to avoid shifting of object 10.

Figure 4:
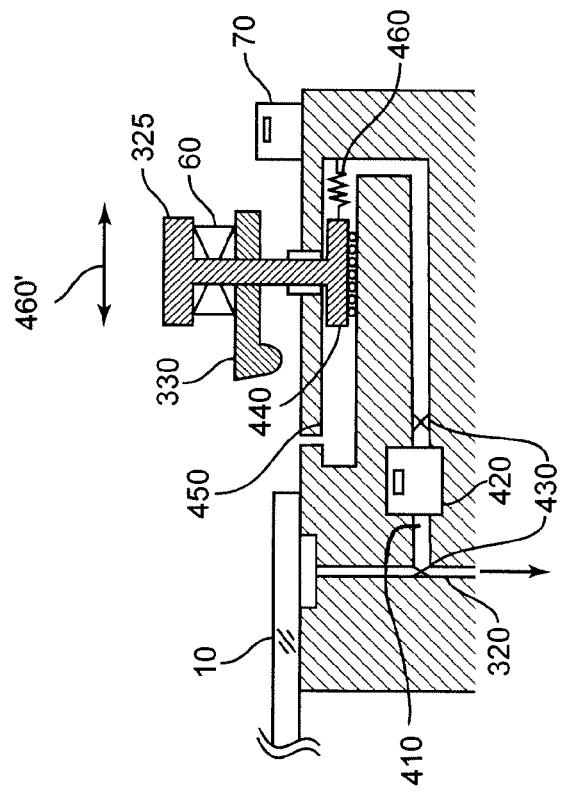
FIG. 4 illustrates a perfecting feature for the arrangement of FIG. 3 to facilitate attachment or removal of a mask/reticle or the like from a vacuum hold-down arrangement of FIG. 3, FIGS. 5, 6 and 7 illustrate a further perfecting feature of the invention for particular exemplary applications such as automated manufacturing.

As can be understood, when an arrangement such as that of FIG. 3 is used in connection with a reticle or mark in a lithographic exposure tool, it is expected that the reticle or mask will be removed and replaced from time-to-time and possibly with significant frequency. In the embodiment of FIG. 3, the jaws 330 of respective clamps extend over the surface of the reticle or wafer and would impede the removal and replacement process. A perfecting feature (90 of FIG. 1) of the invention which avoids such difficulty is illustrated in FIG. 4 which also employs a vacuum chuck and/or hold-down arrangement 320.

Specifically, vacuum diversion passages 410 are provided which are in communication with vacuum passages 320. A sensor assembly with valves 420, the details of which are unimportant to the practice of the invention, is provided to detect the presence of object 10 and to open valve 430 to divert vacuum to retract carriage frame 440, preferably having a movable seal, for example, riding (as indicated by arrow 460') in vented cylinder 450 against a compression spring 460 to retract the clamp from the edge of the location of object 10. This retraction is reliably repeatable, easily synchronized among a plurality of clamp jaws and avoids the need for complex motion to remove the object 10 from among the clamp jaws or more complex mechanical movements of the jaws which may be difficult to synchronize for multiple jaws. When another object is placed in that location, valve 430 is closed and the clamps return to an operative location above the edge of object 10.

Figure 5:
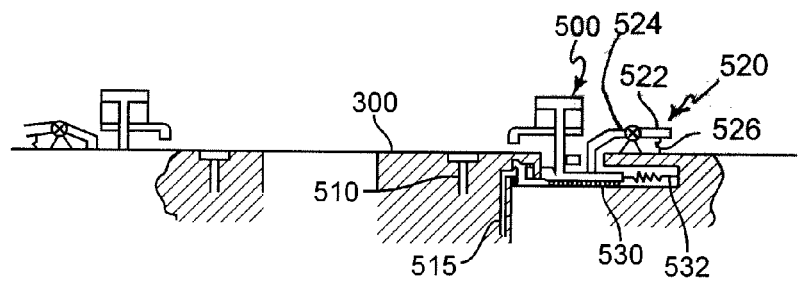
FIGS. 5A, 8, 9, 10, 11 and 12 illustrate preferred implementation details and perfecting features of the invention.
Figure 6:
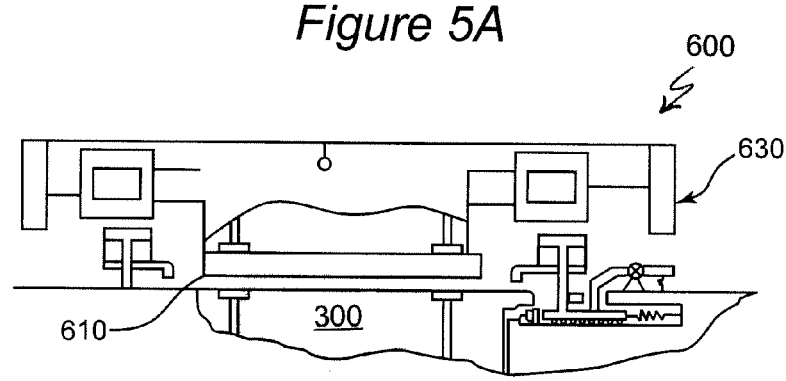
Figure 7:
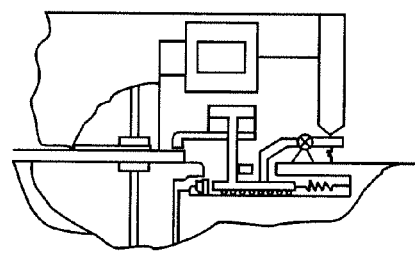

FIGS. 5-7 illustrate a further perfecting feature in this regard which is particularly applicable to automated manufacturing processes and/or automated machinery. Essentially, the arrangement of FIGS. 5-7 depicts motion of the clamps which is also representative of the motion of the clamps in the operation of the arrangement of FIG. 4. However, the pistons, air passages and the jaw retracting mechanism are modified for improved and simplified operation in a highly automated environment; of which an automated reticle handler or loader is exemplary.

FIG. 5 shows a reticle stage vacuum table 300 having vacuum hold down channels 510 and with the acceleration clamps 500 in accordance with the invention in a retracted position prior to placement of a reticle thereon. The clamps are held in a retracted position by a mechanical latch generally indicated at 520 comprising a lever 522 pivoted at 524 and held in a operative position by compression spring 526. In the retracted position, spring 532 is also compressed in a first mode of operation but may be in an unloaded state in a second, alternative mode of operation.

As shown in FIG. 6, a reticle handler/loader 600 is positioned over the vacuum table 300 and carries a reticle 610 by, for example, a vacuum pick-up arrangement. The reticle handler/loader may also carry inductor coils to wirelessly charge or energize the active actuator such as the piezoelectric device(s) illustrated. However, as will be discussed below, such inductors and/or actuators 630 could be provided on a separately positionable structure, as may be desirable in some applications. The reticle handler/loader also preferably carries a mechanical actuator 630 which may be, for example, a linear motor, piezoelectric transducer (PZT) or simply a pin or post set at the proper height to actuate the lever 522 when the reticle loader/handler is lowered to place the reticle 610 on the vacuum hold down table 300 as shown in FIG. 7. At the time the reticle 610 is placed on the vacuum table, a vacuum is applied to vacuum hold down passages 510 and, in the first mode of operation, no pressure is applied through air passage 515.

Figure 5A:
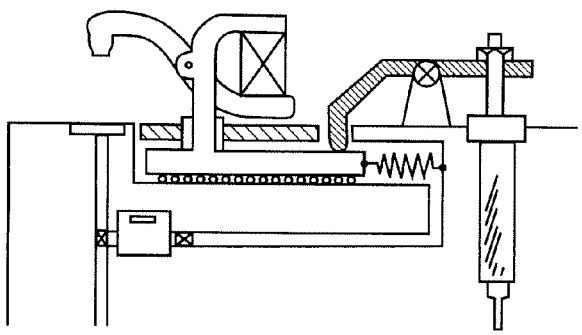

This actuation of the lever 522 of latch 520 releases the piston 530 carrying clamp 500 which is then moved toward the reticle by compressed spring 532 positioning the clamp over the reticle edge. Alternatively or additionally, a separate (e.g. pneumatic) arrangement could be employed to release latch 522, as shown in FIG. 5A At this point, the active actuators 60 of clamps 500 are actuated, preferably by charging through inductors 620 and the clamps 500 brought into contact with the reticle. The reticle handler/loader may be allowed to remain in place during use or the reticle released and the reticle handler/loader moved to another position with or without movement of the inductors 620. However, it is contemplated that the charging of the active actuators 60 of clamps 500 will cause force to be applied during movement of the reticle handler/loader to prevent any vibration or acceleration at the reticle from such movement from causing a shift of the reticle during such movement. Thus, even with the inductors 620 being moved away with the reticle handler/loader, no shifting of the reticle will occur and energization of the active actuators 60 can be performed thereafter in the normal manner (e.g. responsive to an accelerometer of the reticle stage control signals through, for example, wired connections.

When the reticle is to be removed from the vacuum table 300, The reticle handler/loader is repositioned, if moved, and the reticle engaged, preferably by vacuum while the vacuum in vacuum channels 510 is released. The clamps 500 are then de-energized and the clamps 500 moved away from the reticle by application of pressure in air passage(s) 515 which moves piston 530 and compresses spring 532. Then, as the reticle handler/loader 600 is raised, lifting the reticle 610, pivoted lever(s) 522 are released and moved into a latching position by compression spring 526 to retain the pistons 530 and the clamps 500 in a retracted position.

It should be recognized that the piston arrangement of FIGS. 5, 6 and 7 schematically represents a variant form of the piston arrangement of FIG. 4 and, as such, also represents or variant arrangements of suitable mechanisms for clamp positioning and retraction which will be evident to those skilled in the art in view thereof. It should also be appreciated that either of the arrangements of FIGS. 4 or 5-7 could be operated in different ways with only minor modifications which also represent variant forms of the invention and which may develop some operational advantages in some applications. For example, as a second, alternative mode of operation, air passage 515 could be connected to vacuum passages 510 and thus connected to a low-volume vacuum source. In such a case, vacuum passages 510 would serve to vent passage(s) 515 preventing production of significant vacuum. Therefore, prior to the placement of a reticle on vacuum table 300 with the attendant release of latches 520, if provided, piston 530 is unaffected and effectively held in place by spring 532 but will move piston 530 against spring 532 (in tension, in this example) to move the clamp(s) toward the reticle; in effect, synchronizing their movement and further providing, in effect, an interlock which prevents an energized clamp from being driven against an edge of the reticle. When the reticle is to be removed, the vacuum is merely released, possibly in synchronism with drawing a vacuum in the reticle handler/loader, and the clamps are returned to the retracted position by spring 532, operating in tension in this example. Therefore, latch 522 can be omitted but may be useful to retain to avoid motion of the clamp while the reticle is engaged and in the absence of the reticle handler/loader. This mode of operation provides the advantage of simplicity in synchronizing clamp positioning and simplification of control since clamp positioning is initiated by reticle placement and clamp retraction is initiated by removal of vacuum from passages 510 and 515 as may be done with a single valve; both being automatically completed.

It is contemplated that the invention will principally be employed for increasing clamping forces when the assembly 10, 20 is moved, such as in making lithographic projection exposures or the repositioning of an automated inspection camera, and an acceleration is caused while the amount of clamping force applied is well-matched to the actual acceleration detected or predicted and thus the forces applied to object 10 may be minimized. The action of an acceleration measurement device if used and the active actuator is very rapid and generally will exceed the rate of onset of the acceleration to be counteracted, particularly when it is considered that some strain of parts will occur and some degree of frictional engagement maintained under the minimal clamping force passively provided before shifting of the object 10 on surface 20 will occur at the onset of acceleration even if relatively rapid.

However, for some applications where the onset of accelerations is more rapid but predictable, additional control can be applied at terminal 85 (FIG. 1) to provide increased clamping force to withstand, for example, a small acceleration of 2 G's slightly before the predicted, controlled motion which can be increased as actual acceleration is detected. Further, as alluded to above, if the maximum acceleration is known during a controlled motion, dynamic clamping forces may be arranged responsive to the drive signals which control that motion. Similarly, in the case where acceleration is unpredictable, such as impacts during shipping and the assembly is not in use, some degree of increased or additional retention force can be achieved through packing materials or a continuous bias on the active actuator through control unit/processor 80, possibly responsive to an input on terminal 85 or a combination thereof and then supplemented in accordance with accelerometer output. If there are applications where sensor time lag is found to be critical, the initial or first passive force applied might be somewhat larger than required to prevent motion at 1 G acceleration to prevent slippage during the onset of the acceleration.

As alluded to above, even this slight complexity of control can be avoided by arranging the passive actuator 50 to provide maximum clamping force and to counteract that force with the active actuator when no motion or acceleration has been detected for a period of time. However, as alluded to above, such an arrangement does not "fail-safe" in regard to the minimization of forces imposed on the object and requires near-constant energization of the active actuator 60, more power input and more heat dissipation, which can engender other problems and thus is not preferred for applications where the meritorious effects of the invention are most beneficial and advantageous.

Figure 8:
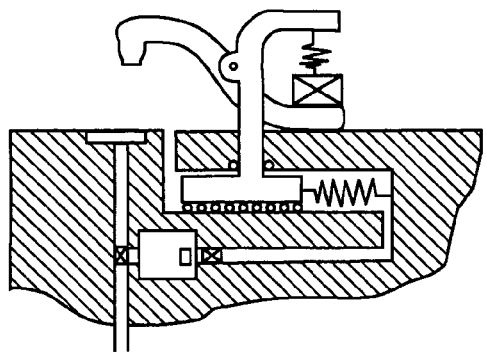
Figure 9:
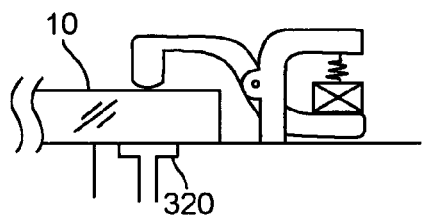

Some additional preferred details of implementation of the invention and/or further perfecting features of the invention will now be described with reference to FIGS. 8-12. For example, as shown in FIG. 8, the sensor for confirming placement of the object 10 on surface 20 can be combined with an actuator with valves to control the deployment of the clamp while also allowing drive of the deployment arrangement 80 from the same vacuum supply. Also, as shown in FIG. 8, it is preferred to provide a movable seal to maintain vacuum on the piston in the cylinder. As illustrated in FIG. 9, it is also preferable to arrange the point of clamp contact with the object 10 opposite to the vacuum hold-down openings 320 in order to minimize the area or volume to which force is applied to object 10; further limiting the potential for damage to other regions of object 10.

Figure 10:
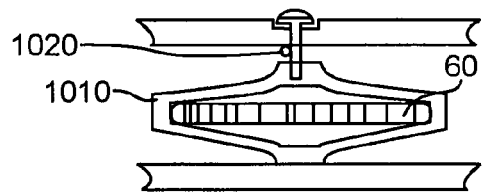

The embodiment illustrated in FIG. 10 employs an actuator with Belleville washers as a preload, although depending on actuator design, the spring preload may not be necessary. The construction of the mechanical advantage actuator, as shown in this embodiment, with a PZT stack 60 and a flexured yoke structure 1010 which can be purchased commercially, is less sensitive to shear forces and is configured in a manner which may be geometrically advantageous in some applications. A similar actuator may employ a pneumatic bellows in place of the PZT stack.

Figure 11:
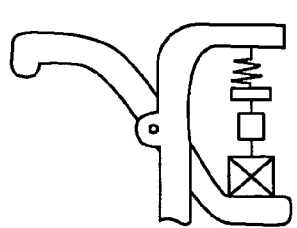

In the embodiment illustrated in FIG. 11, the addition of the flexure (in which the axial direction is constrained to transmit force in that direction and all other degrees of freedom are unconstrained, or universal joint reduces the risk that side loads or shear forces may damage the PZT stack used as an actuator. The spring in series with the flexure or universal joint and actuator provides preload in order for the actuator (e.g. PZT or bellows) to apply variable (increased or decreased) force. The mechanism is designed so that the clamp releases object 10 at the "full travel" point of actuator movement.

Figure 12:
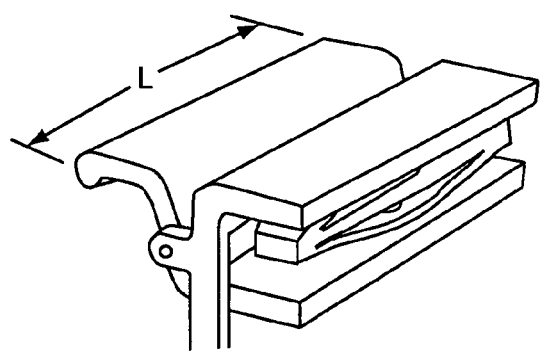

FIG. 12 shows an isometric view of the embodiment of the acceleration assist clamp illustrated in FIG. 10. The length of the bearing area, L, can be optimized for providing the additional clamping forces required with the actuator system chosen.

Figure 13:
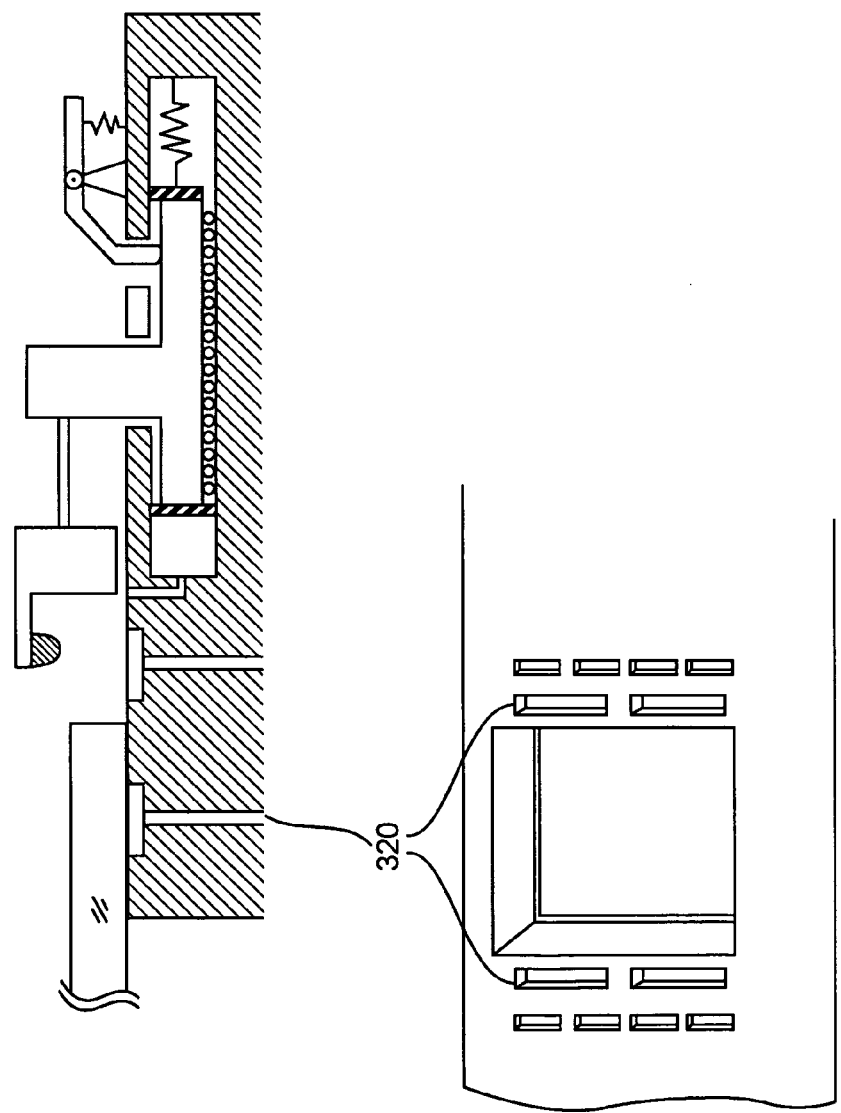

Referring again to FIG. 5, another embodiment of the present invention which is intended to use the additional vacuum ports shown in FIG. 13 (similar to those shown in FIG. 3A) is illustrated in FIGS. 14-17. This variation on the additional vacuum actuator embodiment of FIG. 3A incorporates a mechanism on the stage with additional surface area where extra vacuum is applied to generate additional clamping force. FIG. 13 shows an exemplary arrangement of vacuum ports for holding a reticle, mask or the like object 10 in place on the stage. Such vacuum chucks are used on various stages in lithography tools. Also shown are the extra vacuum port arrays 320' intended to be used with the clamp assist mechanism shown in FIGS. 14-17. One or more of the added ports may be used to provide the required clamping force during acceleration. These extra vacuum ports may also supply a small amount of vacuum during normal operation (e.g. at rest).

FIG. 14 illustrates a configuration similar to that of FIG. 5 in which the PZT 500 and its clamp 30 are replaced with the additional vacuum port(s) 320' and the beam grip 2000 with the thin metal strip 2010. In an initial or unloaded condition, the lock mechanism 520 holds the carriage frame 440 back, allowing the reticle or mask loader to place the reticle/object 10 onto the stage. A mechanical actuator 630

(e.g. as shown in FIG. 6) or another similar mechanism releases the lock mechanism 520 and the preload spring 460 drives the carriage frame forward on, preferably, roller bearings or an air bearing 2020 or similar device. the sensor assembly 420 supplies vacuum to the extra port(s) 320', the thin metal strip 2010 deflects and the beam grip 2000 clamps onto the reticle/object 10. The thin metal strip acts like a thin beam that allows deflection when vacuum is applied at the extra port(s) 320'. The strip deflection can be optimized to allow beam grip 2000 contact with the stage only when vacuum is supplied at extra ports 320' The design of the combined mechanism can be optimized to provide additional clamping forces required with the extra vacuum port array chosen. Like reference numerals are applied to corresponding elements illustrated in FIGS. 5 and 6 and a discussion thereof need not be repeated.

In view of the foregoing, it is seen that the invention provides a method and apparatus for allowing minimization of forces imposed on an object 10 when clamped to a surface 20, which may be a chuck, transport stage, hard or flexured mount, flexured clamp or the like, in an assembly while maintaining accurate alignment and positioning to be maintained through potentially severe accelerations and avoiding such effects of the object as stress-induced birefringence and crystal lattice defect generation and propagation. The invention can be used with any clamping arrangement of any geometry or constitution and can be retrofitted to any existing clamping arrangement.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. An arrangement for positioning an object relative to a surface comprising
    a clamp structure,
    a first actuator for applying a first clamping force to said object,
    means for producing a signal corresponding to acceleration of an assembly of said object and said surface, and
    a second actuator for applying a second clamping force to said object responsive to said means for producing a signal corresponding to said acceleration.

2. An arrangement as recited in claim 1 wherein said first actuator is a passive actuator.

3. An arrangement as recited in claim 1 wherein said second actuator is a dynamic actuator.

4. An arrangement as recited in claim 2 wherein said second actuator is a dynamic actuator.

5. An arrangement as recited in claim 2, wherein said first force is a static force.

6. An arrangement as recited in claim 5, wherein said static force is sufficient to prevent relative motion of said object and said surface under an acceleration of at least 1 G.

7. An arrangement as recited in claim 1, wherein said means for producing a signal corresponding to acceleration is an acceleration measurement device.

8. An arrangement as recited in claim 7, wherein said acceleration measurement device is an accelerometer.

9. An arrangement as recited in claim 1, wherein said means for producing a signal corresponding to acceleration is a motion control system.

10. An arrangement as recited in claim 1, wherein said second force is proportional to said acceleration.

11. An arrangement as recited in claim 1, further comprising
    a lever driven by one of said first actuator and said second actuator.

12. An arrangement as recited in claim 1, further comprising
    a plunger driven by one of said first actuator and said second actuator.

13. An arrangement as recited in claim 1, further comprising
    a flexure having multiple degrees of freedom associated with one of said first and second actuators.

14. An arrangement as recited in claim 1, further comprising
    means for moving said clamp structure along said surface into and out of engagement with said object.

15. An arrangement as recited in claim 1, wherein said clamp structure further comprises a vacuum hold-down arrangement.

* * * * *